(12) United States Patent
Son et al.

(10) Patent No.: US 9,240,764 B2
(45) Date of Patent: Jan. 19, 2016

(54) APPARATUS AND METHOD FOR PREVENTING ACOUSTIC SHOCK OF PORTABLE TERMINAL

(71) Applicant: Samsung Electronics Co., Ltd., Gyeonggi-do (KR)

(72) Inventors: Beak-Kwon Son, Gyeonggi-do (KR); Nam-Il Lee, Gyeonggi-do (KR); Keun-Won Jang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 322 days.

(21) Appl. No.: 13/623,375

(22) Filed: Sep. 20, 2012

(65) Prior Publication Data

US 2013/0102259 A1    Apr. 25, 2013

(30) Foreign Application Priority Data

Oct. 24, 2011    (KR) .................. 10-2011-0108799

(51) Int. Cl.
*H03G 7/00* (2006.01)
*H03G 3/30* (2006.01)
*H03G 11/00* (2006.01)

(52) U.S. Cl.
CPC ............... *H03G 3/301* (2013.01); *H03G 7/002* (2013.01); *H03G 11/008* (2013.01)

(58) Field of Classification Search
None
See application file for complete search history.

(56) References Cited

U.S. PATENT DOCUMENTS

| 7,983,425 B2 * | 7/2011 | Luo ................................. 381/56 |
| 2004/0234079 A1 * | 11/2004 | Schneider et al. .............. 381/58 |
| 2006/0147049 A1 * | 7/2006 | Bayley et al. ................... 381/56 |
| 2007/0024700 A1 * | 2/2007 | Lim et al. .................... 348/14.01 |
| 2008/0025494 A1 | 1/2008 | Zaluaga |
| 2010/0142714 A1 * | 6/2010 | Schneider et al. .............. 381/55 |
| 2011/0045874 A1 * | 2/2011 | Ku et al. .................... 455/569.1 |
| 2011/0171921 A1 | 7/2011 | Son et al. |

* cited by examiner

*Primary Examiner* — Brenda Bernardi
(74) *Attorney, Agent, or Firm* — Cha & Reiter, LLC.

(57) ABSTRACT

An apparatus and method for preventing an acoustic shock of a portable terminal are disclosed. The apparatus includes a transceiver gain determining unit including a table of gain values for sound signals in each of one or more call modes, configured to output a particular gain value corresponding to a particular call mode; a reference value determining unit configured to receive the gain value from the transceiver gain determining unit, monitor a change in the gain value, and determine a predetermined reference energy value based on the change in the gain value; and an output level adjusting unit configured to receive an input signal, compare the input signal with the predetermined reference energy value, and adjust the level of the input signal to output an output signal.

22 Claims, 12 Drawing Sheets

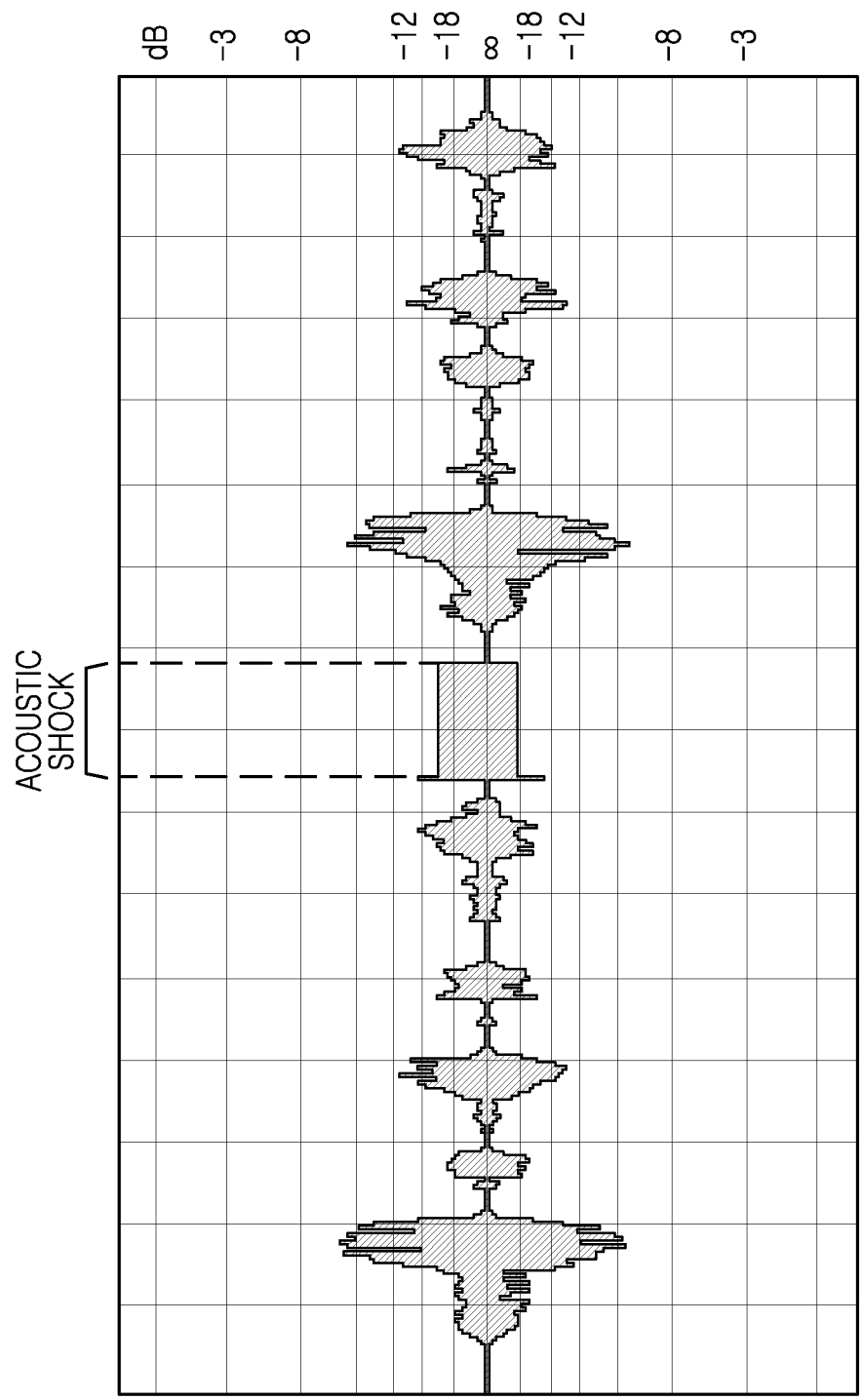

APPARATUS AND METHOD FOR PREVENTING ACOUSTIC SHOCK OF PORTABLE TERMINAL

CLAIM OF PRIORITY

This application claims the benefit of priority under 35 U.S.C. §119 from an application filed in the Korean Intellectual Property Office on Oct. 24, 2011 and assigned Serial No. 10-2011-0108799, the contents of which are incorporated herein by reference in its entirety.

BACKGROUND OF THE INVENTION

1. Field of the Invention

The present invention relates generally to an apparatus and method for preventing an acoustic shock. More particularly, the present invention relates to an apparatus and method for preventing an acoustic shock hazard to users of a portable terminal.

2. Description of the Related Art

An acoustic shock to a portable terminal, which results to a user typically from hearing an unexpected loud sound via a telephone such as a portable terminal, are sometimes referred to as Acoustic Incidents, may interfere with voice signals being transmitted or received during a phone call, thus making it difficult to accurately receive the content of the phone call. Also, a sudden acoustic shock may cause a headache, an auditory damage, and/or a temporary auditory trouble. Additionally some people might experience shock, nausea and anxiety. The headaches, fatigue, and hypersensitivity to loud noise and tinnitus (ringing sound in the ears) may continue unabatedly for days, or weeks. Thus, the acoustic shock is recognized as a serious problem both by users and manufacturers of portable terminals.

An acoustic shock preventing apparatus has been developed in an attempt to solve the problem of acoustic shock. However, because the conventional acoustic shock preventing apparatus considers and processes only a frequency of a specific tone component of an input signal, it is not effective for an acoustic shock such as a white noise that is generated as a large signal over the entire frequency band. In fact, the problem of acoustic shock is particularly unsolved with regard to digital data, and with users of portable terminals sometimes wearing ear buds or headsets, the potential for discomfort or injury is greater than ever.

Also, the conventional acoustic shock preventing apparatus can provide the best performance when applied to the last stage of a receiver path. However, when an additional gain is present at a rear end of a portable terminal, it may cause the problem of an additional tuning issue in the conventional acoustic shock preventing apparatus.

SUMMARY OF THE INVENTION

The present invention substantially solves at least some of the above problems and overcomes disadvantages of conventional apparatuses in order to provide at least the advantages below. Accordingly the present invention provides an apparatus and method for preventing an acoustic shock of a portable terminal, which blocks an acoustic shock during a call operation of the portable terminal and keeps a voice signal undamaged, thus permitting prevention of auditory damage that may be caused by exposure to acoustic shock.

An exemplary aspect of the present invention is to receive a feedback of rear-end gain information in an operation of an acoustic shock preventing apparatus, thus permitting the prevention of the occurrence of an acoustic shock that may be caused by an abnormal gain operation.

The present invention also controls a reference energy value of an acoustic shock output limiter in an acoustic shock preventing apparatus by receiving a feedback of an actual gain value of a gain block at a rear end of the acoustic shock preventing apparatus, by automatically limiting the maximum output in the event of an abnormal gain operation at the rear end of the acoustic shock preventing apparatus.

In accordance with another exemplary aspect of the present invention, an apparatus for preventing an acoustic shock of a portable terminal comprises a transceiver gain determining unit including a table of gain values for sound signals in each of one or more call modes, configured to output a particular gain value corresponding to a particular call mode; a reference value determining unit configured to receive the gain value from the transceiver gain determining unit, monitor a change in the gain value, and determine a predetermined reference energy value based on the change in the gain value; and an output level adjusting unit configured to receive an input signal, compare the input signal with the predetermined reference energy value, and adjust the level of the input signal to output an output signal.

In accordance with yet another exemplary aspect of the present invention, a method for preventing an acoustic shock of a portable terminal comprises outputting, by a transceiver gain determining unit, a particular gain value by applying a gain unit corresponding to a particular call mode; receiving, by a reference value determining unit, the gain value, monitoring a change in the gain value, and determining a predetermined reference energy value based on the change in the gain value; and receiving, by an output level adjusting unit, an input signal, comparing the input signal with the predetermined reference energy value, and adjust the level of the input signal to output an output signal.

BRIEF DESCRIPTION OF THE DRAWINGS

The above and other exemplary aspects and advantages of the present invention will become more apparent to a person of ordinary skill on the art from the following detailed description when taken in conjunction with the accompanying drawings in which:

FIGS. 6A to 6C are graphs illustrating a signal outputted from a speaker in the event of a gain increase in a rear-end unit according to an exemplary embodiment of the present invention;

DETAILED DESCRIPTION

Figure 1:
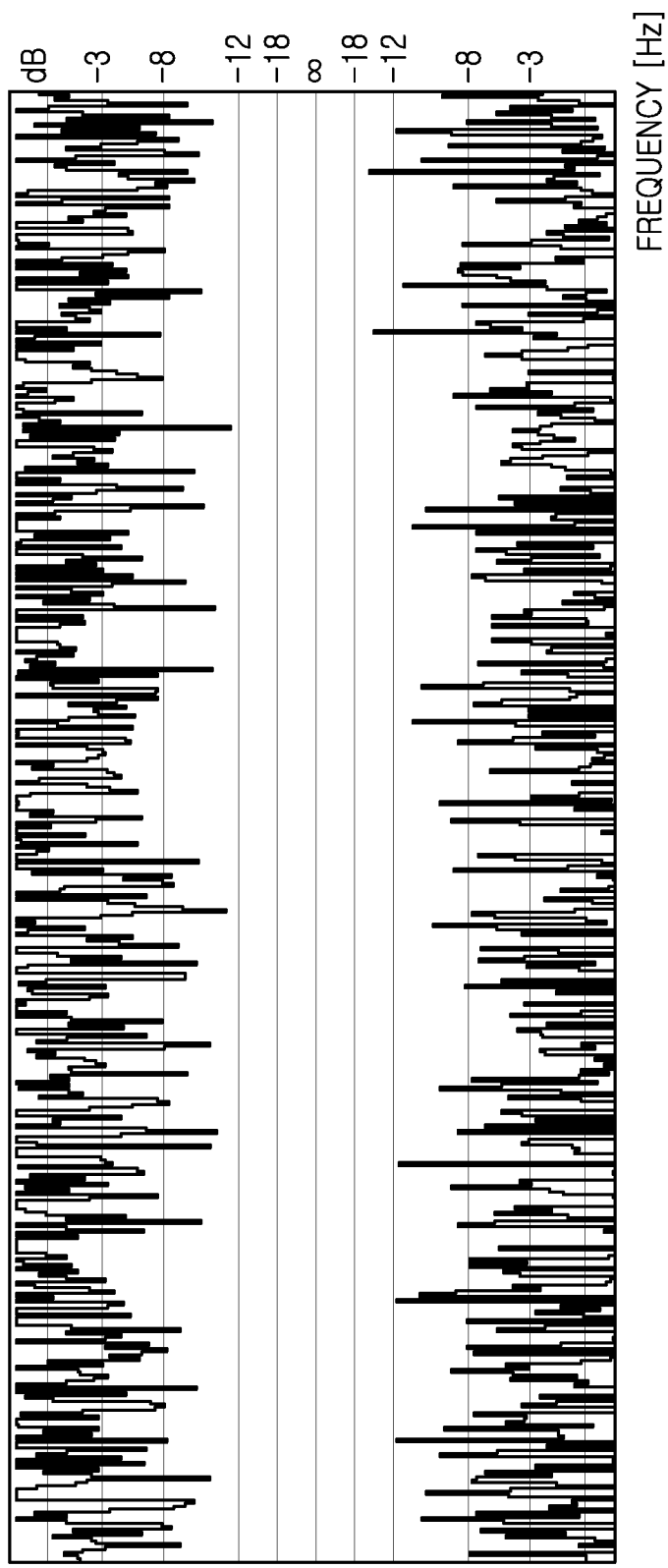
FIG. 1 is a graph illustrating the digital-level representation of an output of an acoustic shock signal caused by a packet error in a network.

Exemplary embodiments of the present invention will now be described herein below with reference to the accompanying drawings. In the following description, detailed descriptions of well-known functions or configurations may be omitted when their inclusion may unnecessarily obscure appreciation by a person of ordinary skill in the art of the subject matter of the present invention. Also, like reference numerals typically denote like elements throughout the drawings.

FIG. 1 is a graph illustrating the digital-level representation of an output of an acoustic shock signal caused by a packet error in a network. The definition of an acoustic shock differs slightly according to the different standardization groups. In general, an acoustic shock is defined as exposure to an 85-90 dBA noise for more than 8 hours per day, and an instantaneous sound volume of more than 120 dBSPL may be defined as an acoustic shock. Acoustic shocks that occur during a phone call may be caused by various sound sources such as a ring back tone and a network acoustic shock. A technology to eliminate a tone signal of a large sound volume greater than a predetermined reference value is used to eliminate an acoustic shock during a phone call. However, in digital devices such as portable terminals and Internet phones, an acoustic shock is sometimes generated as a large signal over the entire frequency band, not in the form of a tone signal but in the form of a rather loud white noise. Therefore, an acoustic shock during a phone call cannot be efficiently eliminated by a technology to eliminate a tone signal of a large sound volume.

Figure 2:
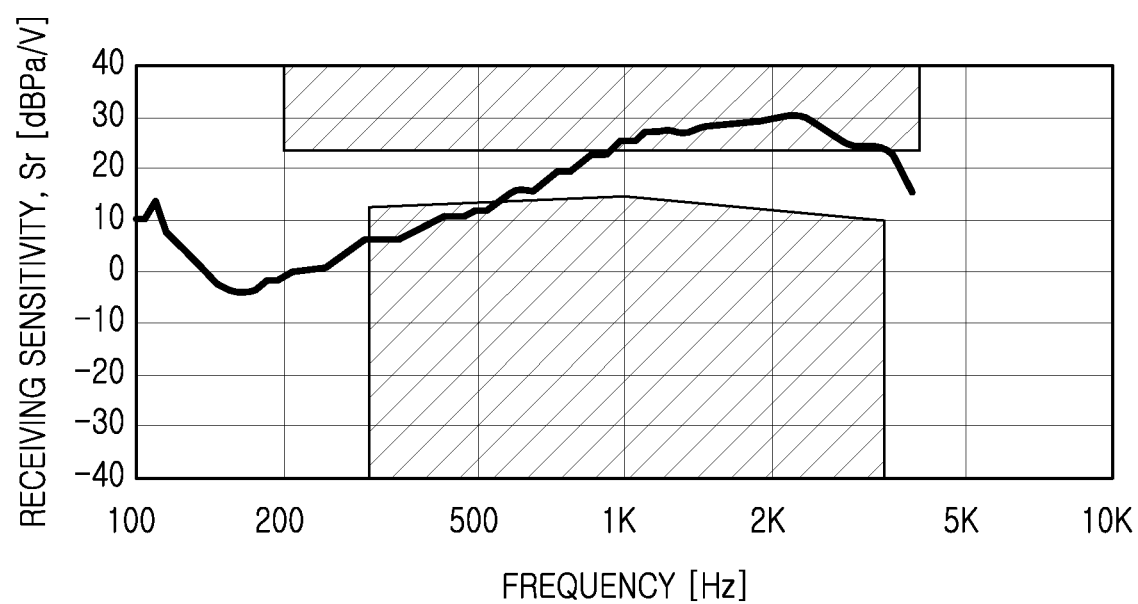
FIG. 2 is a graph illustrating the typical frequency response characteristics of a general portable terminal.

FIG. 2 is a graph illustrating the frequency response characteristics of a general portable terminal that has the problem of acoustic shock as described herein above. Resonance is generated around 3 KHz by a typical human ear canal while a received signal heard at a phone is transmitted from a human earhole to an eardrum. Therefore, during a phone call, a human ear is particularly sensitive to a signal of a frequency band of 1 KHz to 4 KHz. In FIG. 2, an x-axis of the graph represents a frequency, and a frequency band of 1 KHz to 4 KHz is emphasized. A frequency band, to which a human ear is most sensitive as shown by the peak in receiving sensitivity, is emphasized so that a voice signal can be well received when a receiver of a portable terminal is used for a phone call. Thus, a signal of a frequency band of less than 300 Hz or a frequency band of more than 4 KHz, which does not affect a frequency band of 1 KHz to 4 KHz, is not reproduced.

It is intuitively seen from the graph of FIG. 2 that low-frequency signals are not emphasized and medium-frequency or high-frequency signals are emphasized. Thus, an acoustic shock signal with medium-frequency or high-frequency characteristics may be problematic during a phone call. In other words, the human ear is particularly sensitive to when a voice signal and an acoustic shock signal are simultaneously inputted during a phone call, while the voice signal is not problematic because it has low-frequency characteristics, the acoustic shock signal is more strident because a medium or high frequency band is emphasized.

Figure 3:
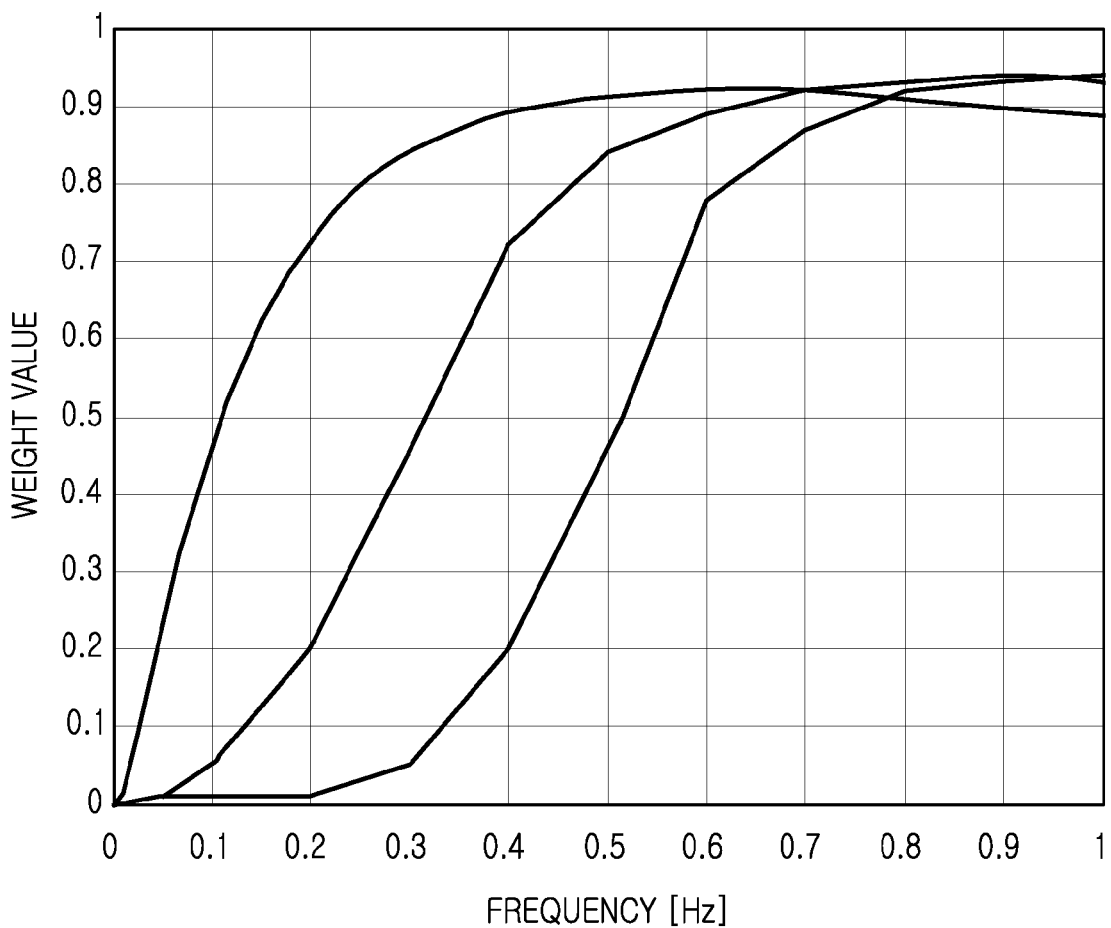
FIG. 3 is a graph illustrating the frequency response characteristics of a frequency weighting filter in an apparatus for preventing an acoustic shock of a portable terminal according to an exemplary embodiment of the present invention.

FIG. 3 is a graph illustrating the frequency response characteristics of a frequency weighting filter in an apparatus for preventing an acoustic shock of a portable terminal according to an exemplary embodiment of the present invention. The frequency weighting filter divides a voice signal from an acoustic shock signal on the basis of the fact that the voice signal and the acoustic shock signal have different main frequency bands. In other words, the frequency weighting filter gives different weights to the voice signal and the acoustic shock signal by applying filters of different weights to different frequency bands.

For example, the weight value may be a real number smaller than or equal to 1. Also, the frequency weighting filter may be a filter that applies a greater weight to a higher frequency band. That is, the frequency weighting filter gives a great weight of nearly 1 to a high frequency band around 4 KHz and gives a small weight of nearly 0 to a low frequency band around 0 KHz, thereby passing an acoustic shock signal (of a received signal) distributed over a high frequency band and reducing the size of a voice signal distributed over a low frequency band. Accordingly, when the received signal passes through the frequency weighting filter, a high-frequency signal is outputted without a reduction in size, whereas a low-frequency signal is outputted with a reduction in size, so that the size difference between the voice signal and the acoustic shock signal increases.

As described above, a human ear is particularly sensitive to a signal of a frequency band of less than 4 KHz. Thus, unlike an audio speaker, a speaker for outputting a call signal typically has a frequency band of less than 4 KHz. Therefore, a frequency band filter may also use a filter applied to a signal of a frequency band of less than 4 KHz.

Three curves are plotted on the graph of FIG. 3. It can be seen from FIG. 3 that a weight value, applied to a low-frequency signal, decreases from the left curve toward the right curve. A manufacturer of an acoustic shock signal eliminating apparatus may select a frequency weighting filter that is most suitable for the acoustic shock signal eliminating apparatus, from among the various frequency weighting filters. The frequency weighting filter may be selected according to whether it is to be used alone or to be installed within a device, and the frequency response characteristics in a speaker caused by a sound quality tuning filter. The manufacturer may select the frequency weighting filter that minimizes a distortion of a voice in a phone call while maximizing an output limitation of an acoustic shock signal, for the acoustic shock signal eliminating apparatus.

Figure 4A:
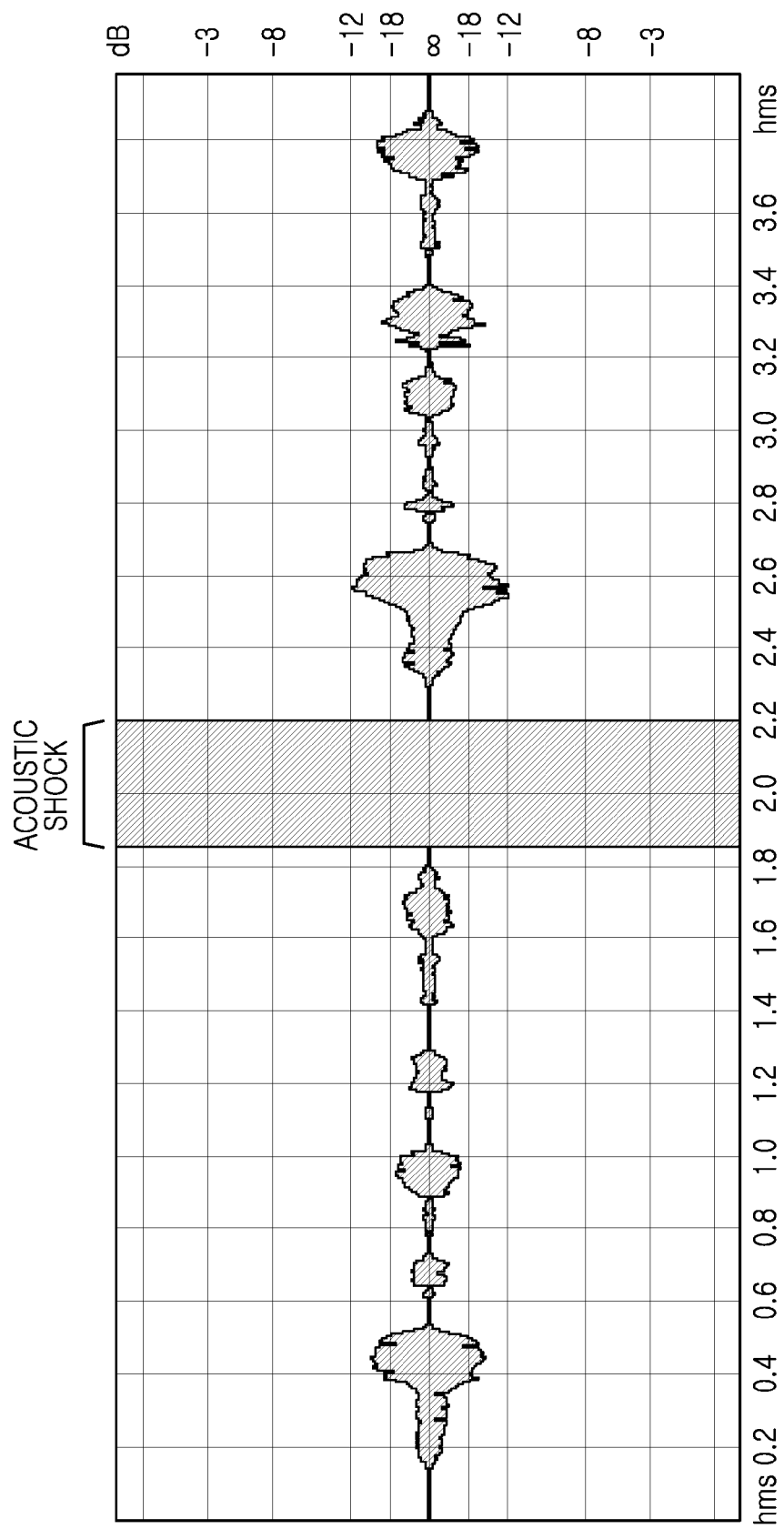
FIGS. 4A and 4B are graphs illustrating an input signal and an output signal of a frequency weighting filter according to an exemplary embodiment of the present invention.
Figure 4B:
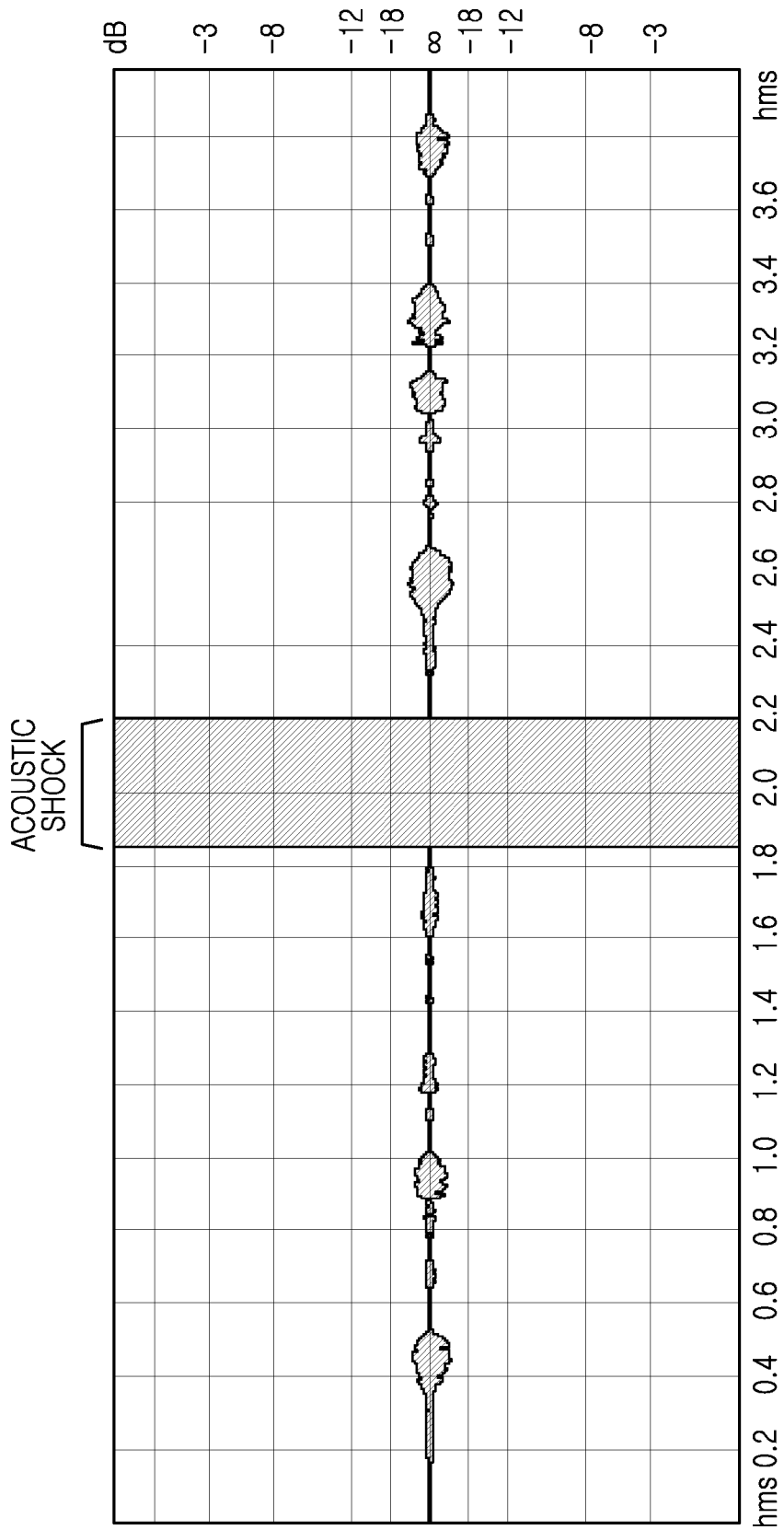

FIGS. 4A and 4B are graphs illustrating an input signal and an output signal of a frequency weighting filter according to an exemplary embodiment of the present invention. In the graphs of FIGS. 4A and 4B, a horizontal axis represents time and a vertical axis represents an energy value of sound signals. FIG. 4A illustrates a received signal, i.e., a decoded Pulse Code Modulation (PCM) signal. In FIGS. 4A and 4B, pillar-shaped signals illustrated in the middle of the graphs represent acoustic shock signals, and other signals than the pillar-shaped signals represent typical voice signals.

Comparing the pillar-shaped signals in the graphs of FIG. 4B and FIG. 4A, an artisan can appreciate that energy values of the pillar-shaped signals, i.e., the acoustic shock signals, are similar to each other. However, comparing other signals than the pillar-shaped signals, i.e., the voice signals, it can be seen that the energy value of the voice signal of FIG. 4B is smaller than the energy value of the voice signal in FIG. 4A.

In other words, the energy value of the voice signal in the low frequency band is decreased by passing through the frequency weighting filter (such as shown in FIG. 4B), and the energy value of the acoustic shock signal in the medium and high frequency bands is not decreased. Because the energy of the voice signal is mostly distributed in the low frequency band, the total energy of the voice signal is decreased after the voice signal passes through the frequency weighting filter. Because the energy of the acoustic shock signal is distributed over the entire frequency band, the total energy of the acoustic shock signal is maintained even after the acoustic shock signal is processed by the frequency weighting filter. Accordingly, after the voice signal and the acoustic shock signal pass through the frequency weighting filter, the energy difference between the voice signal and the acoustic shock signal increases. For example, when the input signal is the voice signal, its energy value is decreased, and when the input signal is the acoustic shock signal, its energy value is increased. Herein, the energy value is a Root Mean Square (RMS) value of the input signal, and is expressed as Equation (1):

$$\sqrt{\frac{1}{N}\sum_{i=1}^{N} X^2(i)} \quad (1)$$

where $X(i)$ denotes the input signal, and $N$ denotes a frame size for RMS calculation.

Referring again to FIG. 4A illustrating the input signal of the frequency weighting filter, an energy value greater than −12 dB may be used as a reference energy value in order to divide output of the acoustic shock signal and the voice signal from each other. On the other hand, referring to FIG. 4B illustrating the output signal of the frequency weighting filter, an energy value smaller than −18 dB may be used as a reference energy value in order to divide the acoustic shock signal and the voice signal. The reference energy value used may be smaller after passing through the frequency weighting filter than before passing through the frequency weighting filter.

Herein, the reference energy value may be predetermined by the user, and may also be defined as a threshold energy value that is the minimum energy value necessary for a certain response. In other words, the energy value of the voice signal may be smaller after being filtered by the frequency weighting filter than before being filtered by the frequency weighting filter, and thus the energy value difference between the voice signal and the acoustic shock signal typically increases. Therefore, the reference energy value used to divide the voice signal and the acoustic shock signal may also decrease.

Figure 5A:
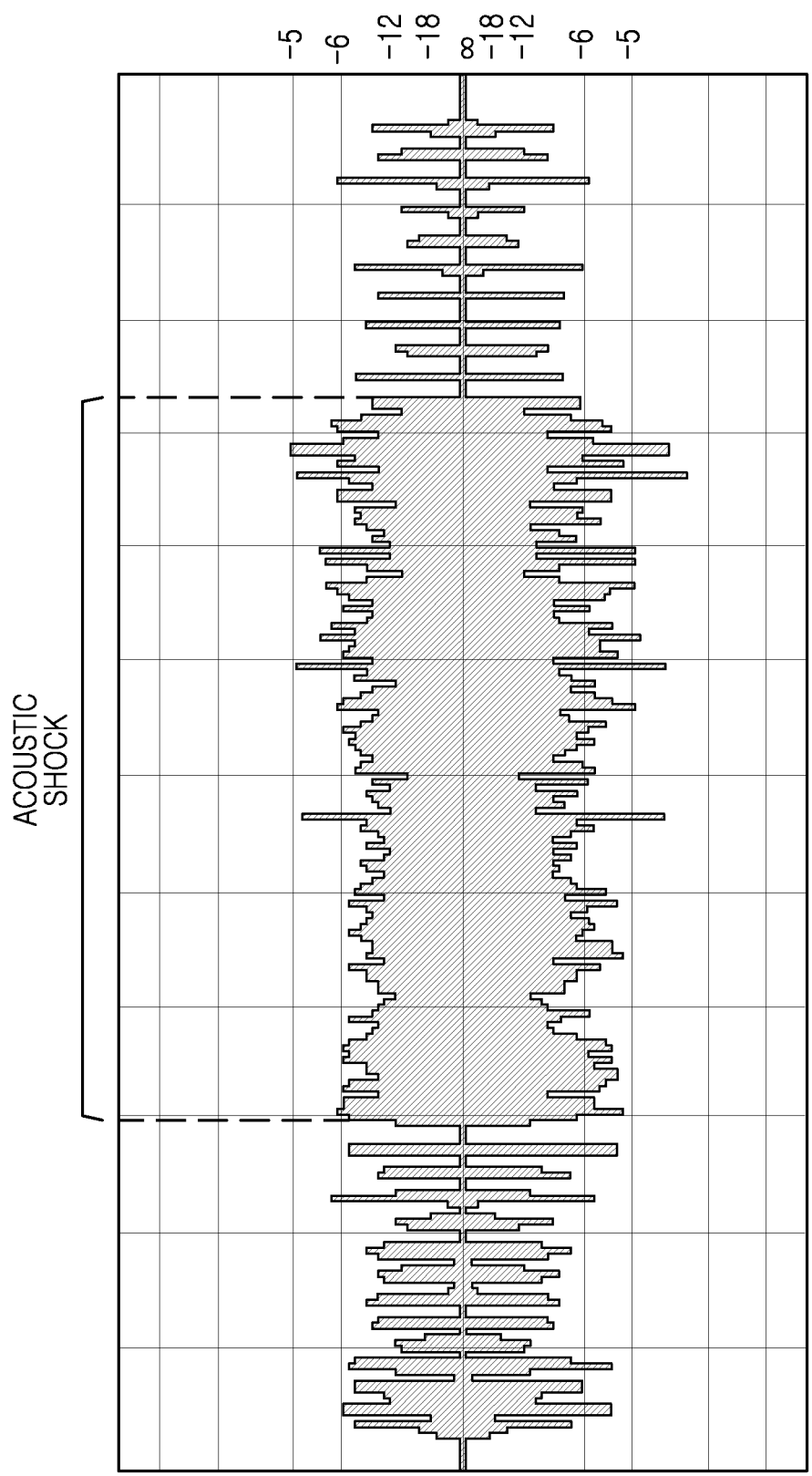
FIG. 5A is a graph illustrating a signal outputted by a speaker according to the related art.
Figure 5B:
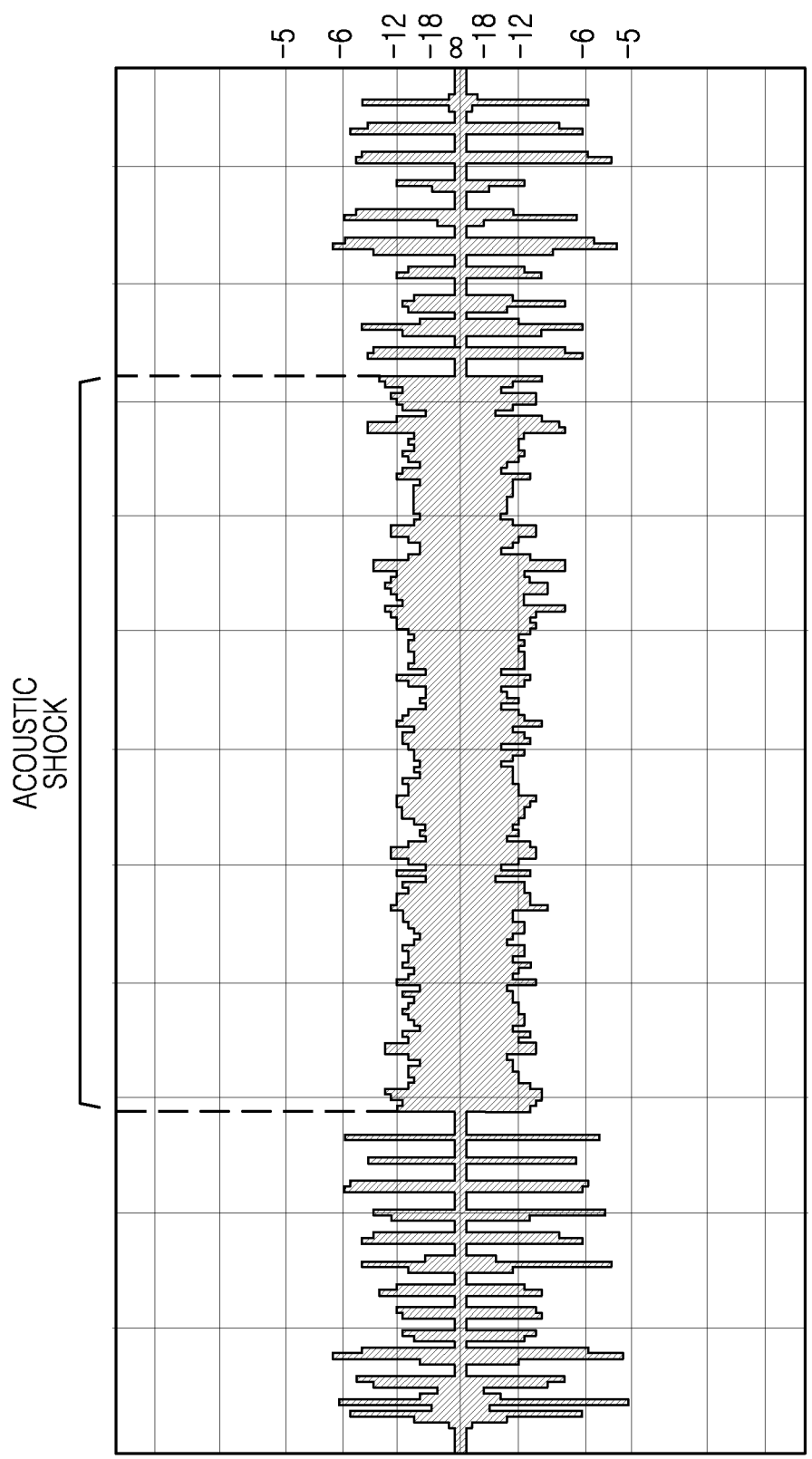
FIG. 5B is a graph illustrating a signal outputted by a speaker according to an exemplary embodiment of the present invention.

FIG. 5A is a graph illustrating a signal outputted by a speaker according to the related art. FIG. 5B is a graph illustrating a signal outputted by a speaker according to an exemplary embodiment of the present invention. In the graphs of FIGS. 5A and 5B, a horizontal axis represents time and a vertical axis represents an energy value. As described in detail with reference to FIGS. 4A and 4B, the energy value of the voice signal is smaller after being filtered by the frequency weighting filter than before being filtered by the frequency weighting filter, and thus the reference energy value used to divide the voice signal and the acoustic shock signal also decreases. Due to the reference energy value decreasing, the gain value that is necessary to control the energy value of the acoustic shock signal included in the filtered signal to the reference energy value decreases.

Thus, when the decreased gain value is applied to the acoustic shock signal of the original received signal, i.e., the decoded PCM signal, the energy value of the acoustic shock signal decreases to the reference energy value and the voice signal maintains the energy value of the original received signal. Therefore, the energy value of the acoustic shock signal in this particular example becomes smaller than the energy value of the voice signal. This change in values is illustrated in FIGS. 5A and 5B. In FIGS. 5A and 5B, wherein dense signals illustrated in the middle of the graphs represent acoustic shock signals, and other signals than the acoustic shock signals represent voice signals. It can be seen from FIGS. 5A and 5B that the energy value of the acoustic shock signal becomes smaller than the energy value of the voice signal.

More specifically, when comparing the signal outputted by the speaker according to the present invention (FIG. 5B) and the signal outputted by the speaker according to the related art (FIG. 5A), an artisan can appreciate that the signal outputted by the speaker according to the present invention has a volume reduction in a large sound source such as an acoustic shock without a distortion of call volume and sound quality. Thus, a user can hear the voice signal without a sound quality distortion. Also, the volume of the acoustic shock signal during a phone call is reduced, thus preventing damage to an auditory sense of the user.

Figure 6A:
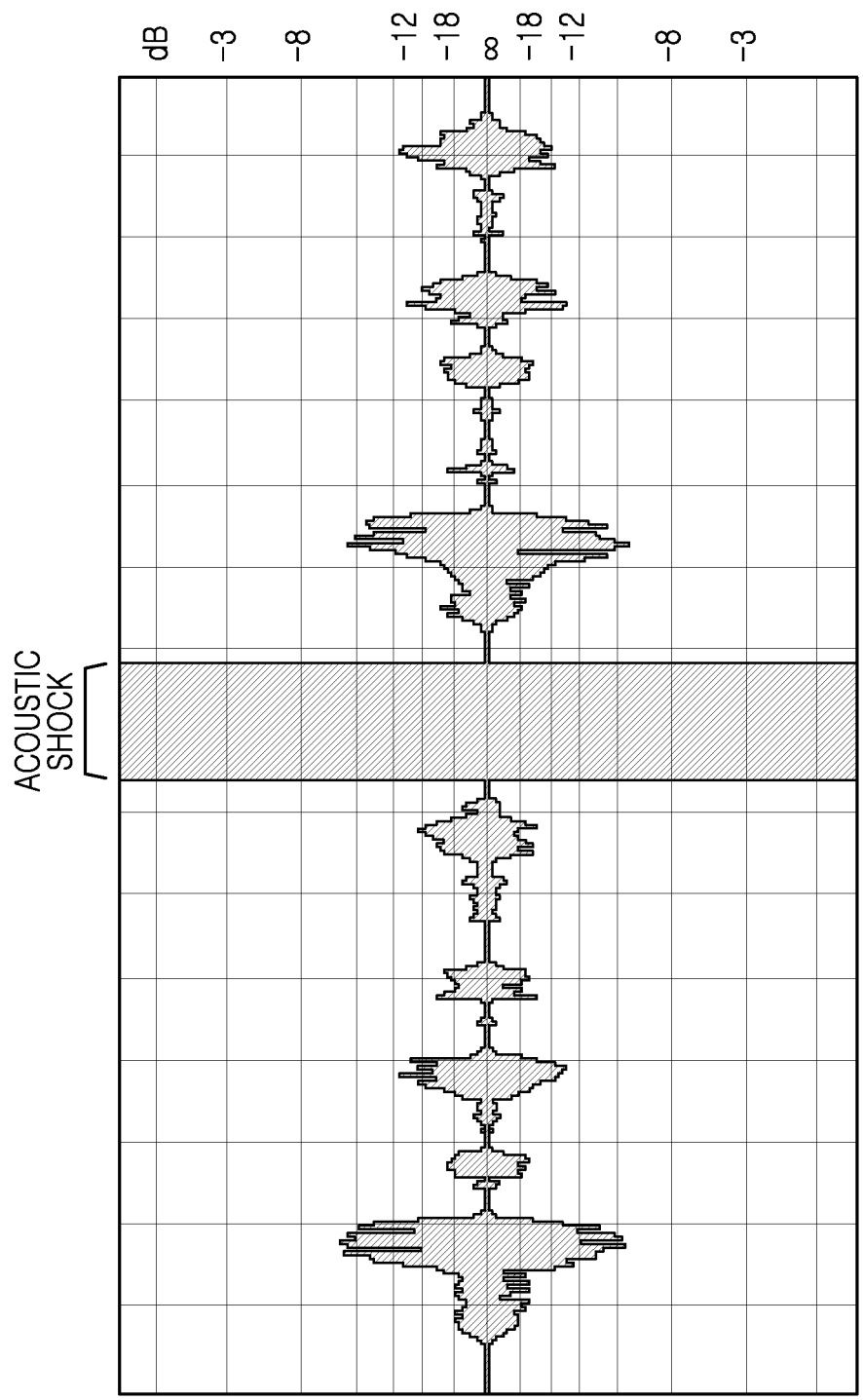
Figure 6C:
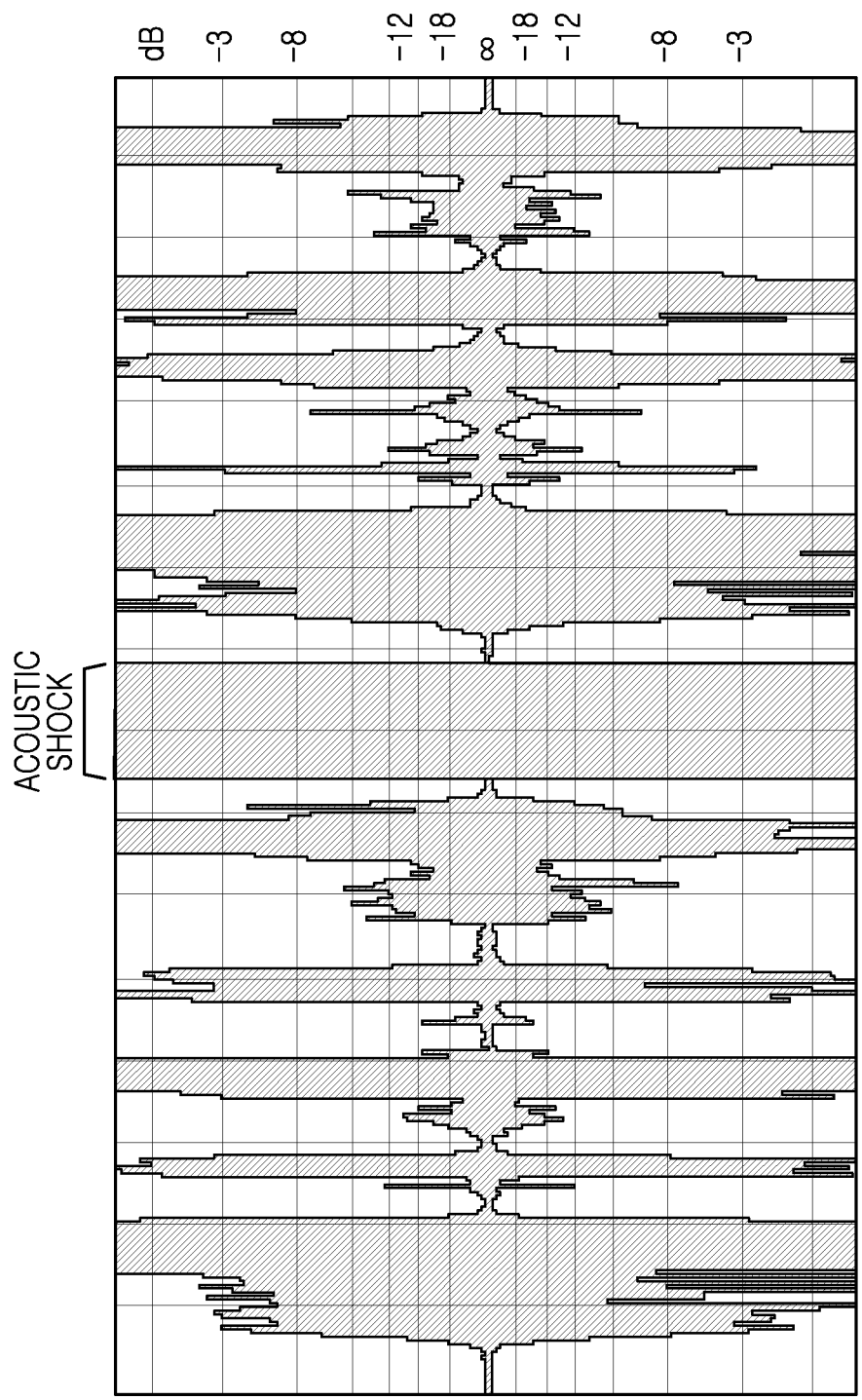

FIGS. 6A to 6C are graphs illustrating a signal outputted from a speaker in the event of a gain increase in a rear-end unit of the portable terminal according to an exemplary embodiment of the present invention. In the present invention, with reference to FIG. 8, a reference energy value changing unit 811 typically stores a reference energy value, and transfers the reference energy value to an acoustic shock output limiter 804. The acoustic shock output limiter 804 receives a decoded PCM signal and receives a signal outputted from a frequency weighting filter 802. The acoustic shock output limiter 804 calculates an RMS value of the signal outputted from the frequency weighting filter 802, and compares the RMS value with the reference energy value. When the RMS value is smaller than the reference energy value, the acoustic shock output limiter 804 passes the received PCM signal. On the other hand, when the RMS value is greater than or equal to the reference energy value, the acoustic shock output limiter 804 limits an output signal. That is, the acoustic shock output limiter 804 presets a reference energy value, and prevents an acoustic shock in a phone call by limiting an output signal such that it does not exceed the reference energy value.

Also, a gain monitoring unit 810 receives a feedback of a gain value transferred from a transceiver gain determining unit 805 to a rear-end unit. The gain monitoring unit 810 may limit the output by again determining whether or not the gain value is increased. In other words, the gain monitoring unit 810 receives a feedback of the gain value transferred from the transceiver gain determining unit 805, and determines whether the gain value is increased according to a call mode. Herein, the gain value is proportional to the size of an output signal corresponding to a predetermined value outputted from the transceiver gain determining unit 805 to at least one of a digital gain unit 806, a digital-to-analog converter (DAC) 807 and an analog gain unit 808 according to a call mode of the portable terminal Specifically, the gain value is defined as the ratio of the amplitude of an input signal to the amplitude of an output signal when a sine wave with predetermined amplitude is used as the input signal in a gain control system, and components thereof. Even when a sine wave amplitude of an input is maintained, if a frequency changes, the amplitude of an output also changes. Therefore, in general, a gain is represented by a function of frequency. When a transfer function of a component is denoted by G(s), a function G(jw), in which 's' of 'G(s)' is replaced with 'jw (frequency)', is called a frequency transfer function or gain of the transfer function G(s). In general, the gain is represented in decibel (dB). The gain represents the level of signal amplification. A gain increase is an increase a signal strength, and a gain decrease is a decrease a signal strength.

In the present invention, the gain value is outputted from the transceiver gain determining unit 805. A predetermined gain value is outputted from the transceiver gain determining unit 805 to at least one of the digital gain unit 806, the DAC 807 and the analog gain unit 808 according to each call mode of the portable terminal. Some examples of the call modes a general call mode, a feature phone call mode, and a Bluetooth call mode. A gain value corresponding to each call mode is prestored in a table of the transceiver gain determining unit 805 and the gain monitoring unit 810, so that the gain monitoring unit 810 can determine whether or not there is a change in the gain value transferred from the transceiver gain determining unit 805.

FIG. 6A illustrates an input signal containing a voice signal and an acoustic shock signal. In FIG. 6A, a pillar-shaped signal illustrated in the middle of the graph is an acoustic shock signal, and the signals illustrated on the left and right sides of the pillar-shaped signal are voice signals. FIGS. 6B and 6C illustrate the case of a gain value increase in a rear-end unit of the portable terminal and the result of application of the present invention. An acoustic shock signal is not generated in an output level adjusting unit 800B of FIG. 8, but a gain value increases in the transceiver gain determining unit 805. FIG. 6C illustrates the case where a 20 dB acoustic shock signal is generated even when a gain value according to a call mode is transferred from the transceiver gain determining unit 805 to a digital gain unit 806, a DAC 807, an analog gain unit 808 and an amplifier 809. The gain value increases by 20 dB, and thus an acoustic shock signal is generated over the entire frequency band. This may cause a serious problem in a call operation of a portable terminal.

FIG. 6B illustrates the result of application of the present invention. As described above, the gain monitoring unit 810 of FIG. 8 receives a feedback of the gain value from the transceiver gain determining unit 805. According to the present invention, the gain monitoring unit 810 stores a gain table according to a call mode, in order to determine that there is a 20 dB increase in the gain value received from the transceiver gain determining unit 805. When determining that there is a 20 dB increase in the gain value, the gain monitoring unit 810 transfers the determination result to the reference energy value changing unit 811. Upon receiving the determination result, the reference energy value changing unit 811 decreases the prestored reference energy value by 20 dB, and transfers the 20 dB-decreased reference energy value to the acoustic shock output limiter 804. Upon receiving the 20 dB-decreased reference energy value, the acoustic shock output limiter 804 limits an output signal by decreasing a PCM signal, received from the decoder 801, by 20 dB. The limited output signal is outputted to the speaker 812 through the digital and analog gain units 806 and 808, the DAC 807 and the amplifier 809. An artisan appreciates from the output result in FIG. 6B that the acoustic shock signal is decreased within the range of about −8 dB without damaging the voice signal. Thus, the chance of auditory discomfort or damage is greatly reduced than known heretofore.

Figure 7:
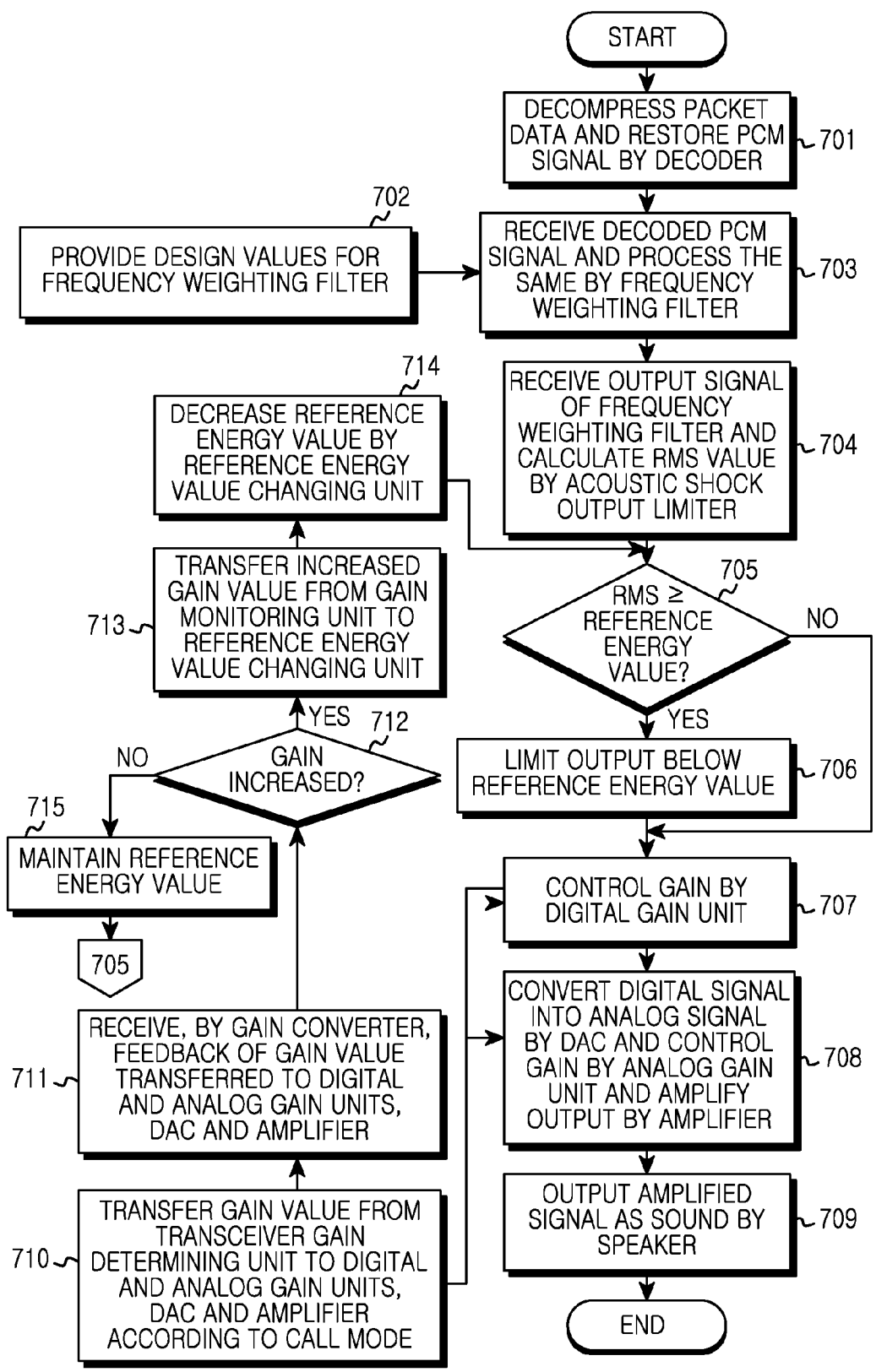
FIG. 7 is a flow diagram illustrating a method for preventing an acoustic shock of a portable terminal according to an exemplary embodiment of the present invention.

FIG. 7 is a flow diagram illustrating exemplary operation of a method for preventing an acoustic shock of a portable terminal according to an exemplary embodiment of the present invention.

Figure 8:
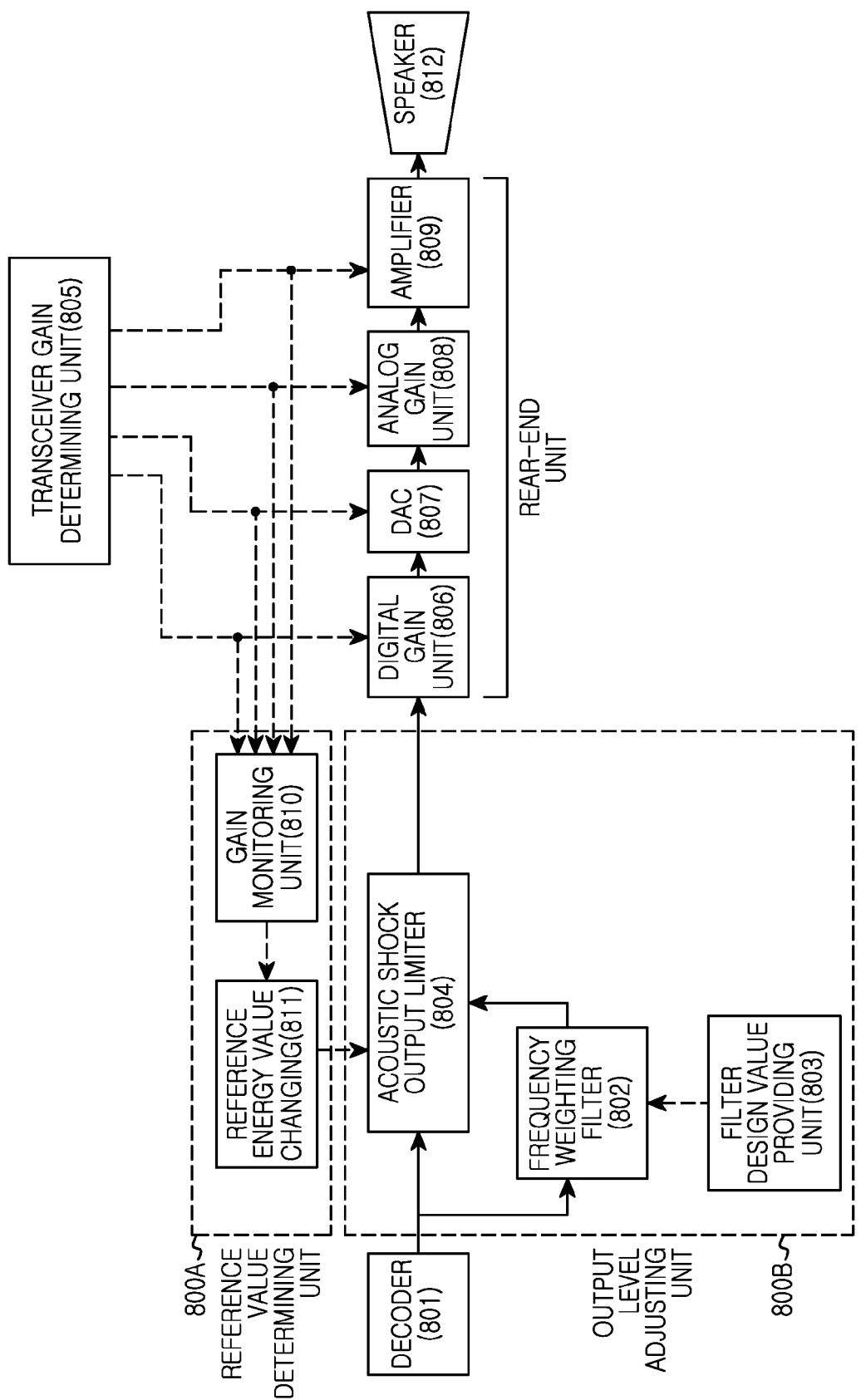
FIG. 8 is a block diagram illustrating an apparatus for preventing an acoustic shock of a portable terminal according to an exemplary embodiment of the present invention.

Referring now to FIG. 7, at (701) the decoder 801 of FIG. 8 decompresses packet data and restores a PCM signal. As for the PCM signal, an analog signal is converted into a digital signal prior to transmission. When applied to broadcasting or recording, the PCM signal can provide high-quality information transmission robust to a noise. In general, information of an electrical signal such as an audio signal or a video signal is transmitted and processed as an analog signal that varies in voltage or current with the lapse of time. However, the analog signal is greatly affected by a noise. Thus, in general, the analog signal is converted into a digital signal. The digital signal is composed of pulses that are instantaneous electrical signals. Therefore, when the presence of pulses is determined after transmission or processing, the digital signal is not difficult to reproduce. Thus, the digital signal is very robust and not as susceptible to a noise as the analog signal.

The PCM signal as an input signal decoded by the decoder 801 is transferred to the frequency weighting filter 802 and the acoustic shock output limiter 804. At (703), the frequency weighting filter 802 receives the decoded PCM signal and performs a frequency weighting filter operation on the received PCM signal. Specifically, the frequency weighting filter 802 receives an input signal and processes the input signal by applying different weights to different frequency bands. For example, in order to divide a medium/high-frequency acoustic shock signal and a low-frequency voice signal, the frequency weighting filter 802 applies a small weight to the voice signal and applies a large weight to the acoustic shock signal.

In addition, for the reason that the frequency response characteristics of the speaker 812 may vary according to whether the frequency weighting filter 802 is to be used alone or to be installed in a device, and a sound quality tuning filter, at (702), design values for a plurality of frequency weighting filters are stored in a filter design value providing unit 803. Thus, the frequency weighting filter 802 may be embodied based on design value selected from among design values stored in the filter design value providing unit 803, in order to filter the decoded PCM signal.

At (704), the acoustic shock output limiter 804 receives an output signal of the frequency weighting filter 802 and calculates an RMS value of the output signal. The RMS value of the output signal is expressed as Equation (2):

$$\sqrt{\frac{1}{N}\sum_{i=1}^{N} X^2(i)} \quad (2)$$

where X(i) denotes the signal filtered by the frequency weighting filter, and N denotes a frame size for RMS calculation.

At 705, the acoustic shock output limiter 804 compares the calculated RMS value with a predetermined reference energy value.

At (706), when the RMS value is greater than or equal to the reference energy value, the acoustic shock output limiter 804 limits the decoded PCM signal below the reference energy value. On the other hand, when at (705) it is determined that the RMS value is smaller than the reference energy value, the acoustic shock output limiter 804 passes the decoded PCM signal without an output limitation.

The PCM signal processed by the acoustic shock output limiter 804 is transferred to the digital gain unit 806. The digital gain unit 806 adjusts a sound. The digital gain unit 806 receives a signal outputted from the transceiver gain determining unit 805 and the acoustic shock output limiter 804, and adjusts the received signal to a suitable level. Upon receiving the digital signal from the digital gain unit 806, the DAC 807 converts the digital signal into an analog signal. The analog gain unit 808 receives the analog signal outputted from the DAC 807, and adjusts the received analog signal to a suitable level.

At (708), the amplifier 809 receives the analog signal from the analog gain unit 808, amplifies the received analog signal and outputs the amplified signal as an output signal. The speaker 812 outputs the amplified signal as a sound. Thereafter, the acoustic shock preventing method is ended.

Also, in the present invention, the gain value transferred from the transceiver gain determining unit 805 is fed back from the gain monitoring unit 810, in order to eliminate an acoustic shock that may be generated at a rear-end unit. Herein, the rear-end unit means that elements between the acoustic shock output limiter 804 and the speaker 812, such as the digital gain unit 806, the DAC 807, the analog gain unit 808 and the amplifier 809. Specifically, at (710), gain values are transferred from the transceiver gain determining unit 805 to the gain units 806 and 808, the DAC 807 and the amplifier 809 according to a call mode.

Thereafter, at (711), the gain monitoring unit 810 receives a feedback of the gain values transferred to the digital and analog gain units 806 and 808, the DAC 807 and the amplifier 809. At (712), the gain monitoring unit 810 adds up the received gain values and determines whether there is a change in the gain value. Like the transceiver gain determining unit 805, the gain monitoring unit 810 prestores gain values that vary according to call modes. Examples of the call modes include a general call mode, a feature phone call mode, and a Bluetooth call mode. In other words, a gain value according to each call mode is prestored in the transceiver gain determining unit 805 and the gain monitoring unit 810.

When there is a change in the gain value, at (713) the gain monitoring unit 810 transfers an increased gain value to the reference energy value changing unit 811. Upon receiving the increased gain value, the reference energy value changing unit 811 subtracts the gain increase value from the reference energy value. In other words, at (714) the reference energy value changing unit 811 decreases the predetermined reference energy value. Thereafter, because the predetermined reference energy value is changed, the changed reference energy value is applied and the above process (following step 705) is repeated. On the other hand, when there is no change in the gain value, at (719) the gain monitoring unit 810 maintains the reference energy value.

FIG. 8 is a block diagram illustrating an apparatus for preventing an acoustic shock of a portable terminal according to an exemplary embodiment of the present invention.

Referring now to FIG. 8, the apparatus preferably includes a decoder 801, a frequency weighting filter 802, a filter design value providing unit 803, an acoustic shock output limiter (or an acoustic shock compressor) 804, a transceiver gain determining unit 805, a digital gain unit 806, a digital-to-analog converter (DAC) 807, an analog gain unit 808, an amplifier 809, a gain monitoring unit 810, a reference energy value changing unit 811, and a speaker 812. A reference value determining unit 800A includes the gain monitoring unit 810, and the reference energy value changing unit 811. The reference value determining unit 800A receives the gain value from the transceiver gain determining unit 805, monitors a change in the gain value, and determines a predetermined reference energy value based on the change in the gain value. An output level adjusting unit 800B includes the frequency weighting filter 802, the filter design value providing unit 803, and the acoustic shock output limiter 804. The output level adjusting unit 800B receives an input signal, compares the input signal with the predetermined reference energy value, and adjusts the level of the input signal to output an output signal. A rear-end unit includes the digital gain unit 806, the DAC 807, the analog gain unit 808 and the amplifier 809, which are rear-end elements between the acoustic shock output limiter 804 and the speaker 812. The DAC 807 may be embodied by a codec. Alternatively, the rear-end unit includes the digital gain unit 806, the analog gain unit 808, and a codec in sequence. Herein, the codec may perform analog-to-digital converter (ADC), DAC fun, and amplification operations. The decoder 801 decompresses packet data and restores a PCM signal as an input signal. The decoder 801 transfers the decoded PCM signal to the frequency weighting filter 802 and the acoustic shock output limiter 804.

The frequency weighting filter 802 receives the decoded PCM signal from the decoder 801 and performs a frequency weighting filter operation on the received PCM signal. More specifically, the frequency weighting filter 802 receives an input signal and processes the input signal by applying different weights to different frequency bands. For example, in order to divide a medium/high-frequency acoustic shock signal and a low-frequency voice signal, the frequency weighting filter 802 applies a small weight to the voice signal and applies a large weight to the acoustic shock signal. Also, because the frequency response characteristics of the speaker 812 may vary according to whether or not the frequency weighting filter 802 is to be used alone or to be installed in a device such as in a portable terminal, and a sound quality tuning filter, a plurality of frequency weighting filters are fabricated and stored in the filter design value providing unit 803. Thus, the frequency weighting filter 802 may be embodied based on design value selected from among design values stored in the filter design value providing unit 803, in order to filter the decoded PCM signal.

With continued reference to FIG. 8, the acoustic shock output limiter 804 receives an output signal of the frequency weighting filter 802 and calculates an RMS value of the output signal. The RMS value of the output signal is calculated according to Equation (2) above. The acoustic shock output limiter 804 compares the calculated RMS value with a predetermined reference energy value. When the RMS value is greater than or equal to the reference energy value, the acoustic shock output limiter 804 limits the decoded PCM signal below the reference energy value. On the other hand, when the RMS value is smaller than the reference energy value, the acoustic shock output limiter 804 passes the decoded PCM signal without output limitation. Thus, the user sets a reference energy value, regards a signal exceeding the reference energy value as an acoustic shock signal, and limits an output, thereby preventing an acoustic shock that may be generated during a phone call.

The digital gain unit 806 receives the PCM signal processed by the acoustic shock output limiter 804. The digital gain unit 806 controls the received signal from the acoustic shock output limiter 804 and adjusts the output value to a suitable level. The DAC 807 converts the digital signal from the digital gain unit 806 into an analog signal. The analog gain unit 808 controls the received signal from the DAC 807 and adjusts the output value to a suitable level.

The amplifier 809 receives the analog signal from the analog gain unit 808, amplifies the received signal and output the amplified signal as an output signal. The speaker 812 outputs the amplified signal as a sound.

The transceiver gain determining unit 805 transfers gain values to the digital gain unit 806, the DAC 807, the analog gain unit 808, and the amplifier 809 according to a particular call mode. Examples of the call modes include a general call mode, a feature phone call mode, and a Bluetooth call mode. In other words, a gain value according to each call mode is prestored in the transceiver gain determining unit 805 and the gain monitoring unit 810.

The gain monitoring unit 810 receives a feedback of the gain values transferred to the digital gain unit 806, the DAC 807, the analog gain unit 808, and the amplifier 809. The gain monitoring unit 810 adds up the received gain values and determines whether there is a change in the gain value.

The reference energy value changing unit 811 stores a predetermined reference energy value. As described above, the reference energy value changing unit 811 receives a changed gain value from the gain monitoring unit 810. When receiving an increased gain value from the gain monitoring unit 810, the reference energy value changing unit 811 subtracts the gain increase value from the reference energy value. That is, the reference energy value changing unit 811 decreases the predetermined reference energy value.

The units described herein may be implemented using hardware components and software components loaded into hardware components. For example, microphones, amplifiers, band-pass filters, audio to digital convertors, and processing devices. A processing device may be implemented using one or more general-purpose that becomes a special purpose computer upon being configured, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device also may access, store, manipulate, process, and create data in response to execution of the software. For purposes of simplicity, the description of a processing device is used in a singular sense; however, one skilled in the art will appreciate that a processing device may include multiple processing elements and multiple types of processing elements. For example, a processing device may include multiple processors or a processor and a controller. In addition, different processing configurations are possible, such a parallel processors.

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor" or "microprocessor" constitute hardware in the claimed invention.

Program instructions that may perform a method described herein when loaded into hardware such as a microprocessor controller, may be recorded, stored, or fixed in one or more computer-readable storage media. The program instructions are executed by hardware such as a processor or microprocessor of a computer. For example, the computer causes a processor to execute the program instructions. The media may include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter.

A person of ordinary skill in the art understands and appreciates that the claimed invention is not software per se, and the method steps are performed by hardware such as a controller. Also, functional programs, codes, and code segments for accomplishing the example embodiments disclosed herein can be easily construed by programmers skilled in the art to which the exemplary embodiments may pertain function according to the flow diagrams and block diagrams of the figures and their corresponding descriptions as provided herein. Also, the described unit to perform an operation or a method may be hardware, software loaded into hardware, or some combination of hardware and software.

While the invention has been shown and described with reference to certain exemplary embodiments thereof, it will be understood by those skilled in the art that various changes in form and details may be made therein without departing from the spirit and scope of the invention as defined by the appended claims Therefore, the scope of the invention is defined not by the detailed description of the invention but by the appended claims, and all differences within the scope will be construed as being included in the present invention.

What is claimed is:

1. An apparatus for preventing an acoustic shock of an electronic device, comprising:
    a transceiver gain determining unit configured to output a gain value corresponding to a call mode to a rear-end unit of the apparatus;
    a reference value determining unit configured to receive a gain value fed back from the rear-end unit, compare the fed back gain value with a previously stored gain value, and change a reference energy value based at least in part on the difference between the fed back gain value and the previously stored gain value; and
    an output level adjusting unit configured to receive an input signal, filter the received input signal by a frequency weighting filter, and adjust an output level of the input signal by comparing the filtered signal with the changed reference energy value.

2. The apparatus of claim 1, wherein the rear-end unit comprising:
    a digital gain unit configured to receive the gain value output from the transceiver gain determining unit and the output signal of the output level adjusting unit, and control the gain of the output signal of the output level adjusting unit;
    a digital-to-analog converter (DAC) configured to receive the gain value from the transceiver gain determining unit and the digital gain-controlled signal from the digital gain unit, and convert the digital gain-controlled signal into an analog signal; and
    an analog gain unit configured to receive the gain value output from the transceiver gain determining unit and the analog signal of the DAC, control the gain of the analog signal of the DAC, and output an analog gain-controlled signal.

3. The apparatus of claim 2, further comprising:
    an amplifier configured to receive the analog gain-controlled signal, and amplify the analog gain-controlled signal; and a speaker configured to output the amplified analog signal as a sound.

4. The apparatus of claim 1, wherein the reference value determining unit comprises:
a gain monitoring unit configured to monitor a change in the gain value based at least in part on the difference; and
a reference energy value changing unit configured to store the reference energy value, change the reference energy value upon reception of the gain value changed from the monitoring unit, and transfer the changed reference energy value to the output level adjusting unit.

5. The apparatus of claim 4, wherein the reference energy value changing unit is configured to reduce the reference energy value by a gain value increase.

6. The apparatus of claim 1, wherein the output level adjusting unit comprises:
the frequency weighting filter configured to receive the input signal, and generate the filtered signal by applying a greater weight to a higher frequency band than a weight applied to a lower frequency band; and
an acoustic shock output limiter configured to receive the input signal and the filtered signal from the frequency weighting filter, calculate and compare a Root Mean Square (RMS) energy value of the filtered signal with the changed reference energy value, and control the output level of the input signal.

7. The apparatus of claim 6, further comprising:
a decoder configured to decode the input signal as a Pulse Code Modulation (PCM) signal, and transfer the decoded PCM signal to the frequency weighting filter and the acoustic shock output limiter.

8. The apparatus of claim 6, wherein the frequency weighting filter is configured to analyze the input signal and filter the input signal, which minimizes a signal distortion in a low frequency band and maximizes a signal output in a high frequency band.

9. The apparatus of claim 6, wherein the acoustic shock output limiter is configured to calculate an RMS energy value of the filtered signal from the frequency weighting filter;
compare the RMS energy value of the filtered signal from the frequency weighting filter with the reference energy value, pass the input signal when the reference energy value is greater than the RMS energy value, and control the input signal to decrease the input signal to a value that is less than or equal to the reference energy value when the RMS energy value is greater than or equal to the reference energy value.

10. The apparatus of claim 6, wherein the RMS energy value is calculated according to the following equation:

$$\sqrt{\frac{1}{N}\sum_{i=1}^{N} X^2(i)}$$

where X(i) denotes the signal filtered by the frequency weighting filter, and N denotes a frame size for RMS calculation.

11. The apparatus of claim 1, wherein the gain value is determined according to a call mode of the electronic device.

12. A method for preventing an acoustic shock of an electronic device, comprising:
outputting, by a transceiver gain determining unit, a gain value corresponding to a call mode to a rear-end unit of the electronic device;
receiving, by a reference value determining unit, a gain value fed back from the rear-end unit, comparing the fed back gain value with a previously stored gain value, and change a reference energy value based at least in part on the difference between the fed back gain value and the previously stored gain value;
receiving, by an output level adjusting unit, an input signal;
filtering, by an output level adjusting unit, the received input signal by a frequency weighting filter; and
adjusting, by an output level adjusting unit, an output level of the input signal by comparing the filtered signal with the changed reference energy value.

13. The method of claim 12, further comprising:
receiving, by a digital gain unit, the gain value output from the transceiver gain determining unit and the output signal controlled of the output level adjusting unit, and controlling the gain value of the output signal of the output level adjusting unit;
receiving, by a digital-to-analog converter (DAC), the gain value from the transceiver gain determining unit and the digital gain-controlled signal from the digital gain unit, and converting the digital gain-controlled signal into an analog signal; and
receiving, by an analog gain unit, the gain value output from the transceiver gain determining unit and the analog signal of the DAC, controlling the gain of the analog signal of the DAC, and output an analog gain-controlled signal.

14. The method of claim 13, further comprising:
receiving, by an amplifier, the analog gain-controlled signal, and amplifying the analog gain-controlled signal; and
outputting, by a speaker, the amplified analog signal as a sound.

15. The method of claim 12, further comprising:
monitoring, by a gain monitoring unit, a change in the gain value based at least in part on the difference; and
storing, by a reference energy value changing unit, the reference energy value, changing the reference energy value upon reception of the gain value changed from the monitoring unit, and transferring the changed reference energy value to the output level adjusting unit.

16. The method of claim 15, further comprising:
reducing, by the reference energy value changing unit, the reference energy value by a gain value increase.

17. The method of claim 12, wherein adjusting the output level of the input signal comprises,
receiving, by the frequency weighting filter, the input signal, and generating the filtered signal by applying a greater weight to a higher frequency band than a weight applied to a lower frequency band; and
receiving, by an acoustic shock output limiter, the input signal and the filtered signal from the frequency weighting filter, calculating and comparing a Root Mean Square (RMS) energy value of the filtered signal with the changed reference energy value, and controlling the output level of the input signal.

18. The method of claim 17, further comprising:
decoding, by a decoder, the input signal as a Pulse Code Modulation (PCM) signal, and transferring the decoded PCM signal to the frequency weighting filter and the acoustic shock output limiter.

19. The method of claim 17, wherein the receiving of the input signal, and generating the output signal by applying a greater weight to a higher frequency band than a weight applied to a lower frequency band comprises: analyzing, by the frequency weighting filter, the input signal and filter the input signal, which minimizes a signal distortion in a low frequency band and maximizes a signal output in a high frequency band.

20. The method of claim 17, wherein the receiving of the input signal and the output signal from the frequency weighting filter, calculating and comparing a Root Mean Square (RMS) energy value of the filtered signal from the frequency weighting filter with the reference energy value, and controlling the level of the input signal comprises:

comparing, by the acoustic shock output limiter, the RMS energy value of the filtered signal from the frequency weighting filter with the reference energy value, passing the input signal when the reference energy value is greater than the RMS energy value, and controlling the input signal to decrease the input signal to a value that is less than or equal to the reference energy value when the RMS energy value is greater than or equal to the reference energy value.

21. The method of claim 17, wherein the RMS energy value is determined according to the following equation:

$$\sqrt{\frac{1}{N}\sum_{i=1}^{N} X^2(i)}$$

where X(i) denotes the signal filtered by the frequency weighting filter, and N denotes a frame size for RMS calculation.

22. The method of claim 12, wherein the gain value is determined according to a call mode of the electronic device.

\* \* \* \* \*